United States Patent [19]
Girard

[11] Patent Number: 4,462,001
[45] Date of Patent: Jul. 24, 1984

[54] BASEBAND LINEARIZER FOR WIDEBAND, HIGH POWER, NONLINEAR AMPLIFIERS

[75] Inventor: Henri Girard, St-Lambert, Canada

[73] Assignee: Canadian Patents & Development Limited, Ottawa, Canada

[21] Appl. No.: 350,827

[22] Filed: Feb. 22, 1982

[51] Int. Cl.³ .............................................. H03F 1/32
[52] U.S. Cl. ..................... 330/149; 328/163; 375/57
[58] Field of Search ................. 330/43, 149; 328/155, 328/163, 166; 332/18, 37 R; 455/50, 63, 276, 304; 375/51, 54, 34, 57, 60, 99

[56] References Cited

U.S. PATENT DOCUMENTS

| | | | |
|---|---|---|---|
| 3,675,138 | 7/1972 | Standing | 328/163 |
| 4,291,277 | 9/1981 | Davis et al. | 375/60 X |
| 4,308,618 | 12/1981 | Lévy et al. | 375/99 X |

OTHER PUBLICATIONS

Graeme et al., *Operational Amplifiers, Design & Applications*, McGraw-Hill 1971, pp. 236-265.
Satoh et al., "Nonlinear Satellite Channel Design for QPSK/TDMA Transmission," Fifth International Conference on Digital Communications by Satellite, Genoa, Italy, 1981, pp. 47-54.

*Primary Examiner*—James B. Mullins
*Attorney, Agent, or Firm*—Edward Rymek

[57] ABSTRACT

The baseband linearizer attenuates the amplitude of the in-phase and quadrature phase components of the baseband signal as a function of the transfer characteristic of the high power amplifier and under the control of a baseband signal power level detector. The phase angle of the attenuated signal is rotated as a function of the amplifier transfer characteristic, again under the control of the power level detector.

4 Claims, 4 Drawing Figures

BASEBAND LINEARIZER FOR WIDEBAND, HIGH POWER, NONLINEAR AMPLIFIERS

BACKGROUND OF THE INVENTION

The invention is directed to wideband, high power, nonlinear amplifiers, and particularly to the linearization of such amplifiers.

The linearization of high power microwave amplifiers used in satellite earth stations has received much attention recently, since such amplifiers presently have to be operated below saturation in their linear region which is inefficient and expensive, or use microwave implementations of linearizers which are expensive to manufacture. One example of an implementation of microwave predistortion is found in the publication by G. Satoh et al, entitled "Nonlinear Satellite Channel Design for QPSK/TDMM Transmission", Fifth International Conference on Digital Communications by Satellite, Genoa, Italy, 1981, pp 47-54. The predistortion circuit has a characteristic which approaches the inverse of that of the high power amplifier. Because of the physical limitation on the power output of the amplifier, at the best, the characteristics of a soft limiter can be obtained for the cascade of the predistortion linearizer and the memoryless nonlinear amplifier.

SUMMARY OF THE INVENTION

It is therefore an object of this invention to provide apparatus for linearizing the transfer characteristics of a high power amplifier by predistorting the signal prior to its modulation.

This and other objects are achieved in a baseband linearizer which includes an amplitude attenuator that receives the baseband signal and attenuates its amplitude as a function of the high power amplifier transfer characteristic, and a phase rotating circuit that receives the attenuated baseband signal and rotates its phase angle as a function of the high power amplifier transfer characteristic. The baseband linearizer may further include a detector for determining the power level of the baseband signal in order to control the attenuator and the phase rotating circuit.

In accordance with another aspect of this invention, the attenuator may include two attenuators, one for attenuating the amplitude of in-phase component X, and the other for quadrature phase component Y, of the baseband signal. In addition, a first memory provides the attenuation factor to the first and second attenuators under the control of the power level detectors.

In accordance with a further aspect of this invention, the phase rotating circuit may operate on the attenuated in-phase component $X'$ and the attenuated quadrature component $Y'$ to provide an output signal having an in-phase component $X'' = X' \cos\theta - Y' \sin\theta$ and a quadrature phase component $Y'' = Y' \cos\theta + X' \sin\theta$, where the rotation factor $\theta$ is provided to the phase rotation circuit by a second memory under the control of the power level detector.

The phase rotation circuit may include a first multiplier and a second multiplier for receiving the in-phase component $X'$ and signals $\cos\theta$ and $\sin\theta$, respectively, from the memory, and a third multiplier and a fourth multiplier for receiving the quadrature component $Y'$ and signals $\sin\theta$ and $\cos\theta$, respectively, from the memory. A first summing circuit receives the output from the first multiplier and an inverted output from the third multiple to provide in-phase component $X'' = X' \cos\theta - Y' \sin\theta$ of the predistorted baseband signal. A second summing circuit receives the output from the second multiplier and the output from the fourth multiplier to provide the quadrature component $Y'' = Y' \cos\theta + X' \sin\theta$ of the predistorted baseband signal.

Many other objects and aspects of the invention will be clear from the detailed description of the drawings.

DETAILED DESCRIPTION

High power amplifiers (HPA), such as helix travelling wave tubes (TWT), can be used by a single or by many carriers. The present invention will be described in the context of a system where a single carrier is transmitted through an earth station high power amplifier, and the modulator is assumed to use premodulation low-pass filtering; though it equally applies to other high power amplifier systems. This system is popular for low data rates (64 kb/s range) as well as for high data rates (120 Mb/s range) because of the ease of obtaining a spectrum symmetrical about the carrier frequency. Bandpass filters which have such an arithmetic symmetry are often more difficult to synthesize. The effects of up converter filters, can be rendered negligible by the appropriate choice of the intermediate frequency and filter bandwidth.

The modulated quadriphase shift keyed (QPSK) signal transmitted through a memoryless nonlinearity is given by the equation:

$$e(t) = g[(x^2 + y^2)^{\frac{1}{2}}]\cos\{\omega_o t + \tan^{-1}[y/x] + f[(x^2 + y^2)^{\frac{1}{2}}]\}$$

where $\omega_o$ is the carrier frequency
    g is the AM to AM transfer characteristic dependent on the power of the signal envelope
    f is the AM to PM transfer characteristic dependent on the power of the signal envelope, and
  x and y are the in-phase and quadrature components of the signal respectively.

The AM/AM and AM/PM characteristics are specific to each particular high power amplifier. These may be obtained experimentally, but are normally supplied by the manufacturer.

Figure 1:
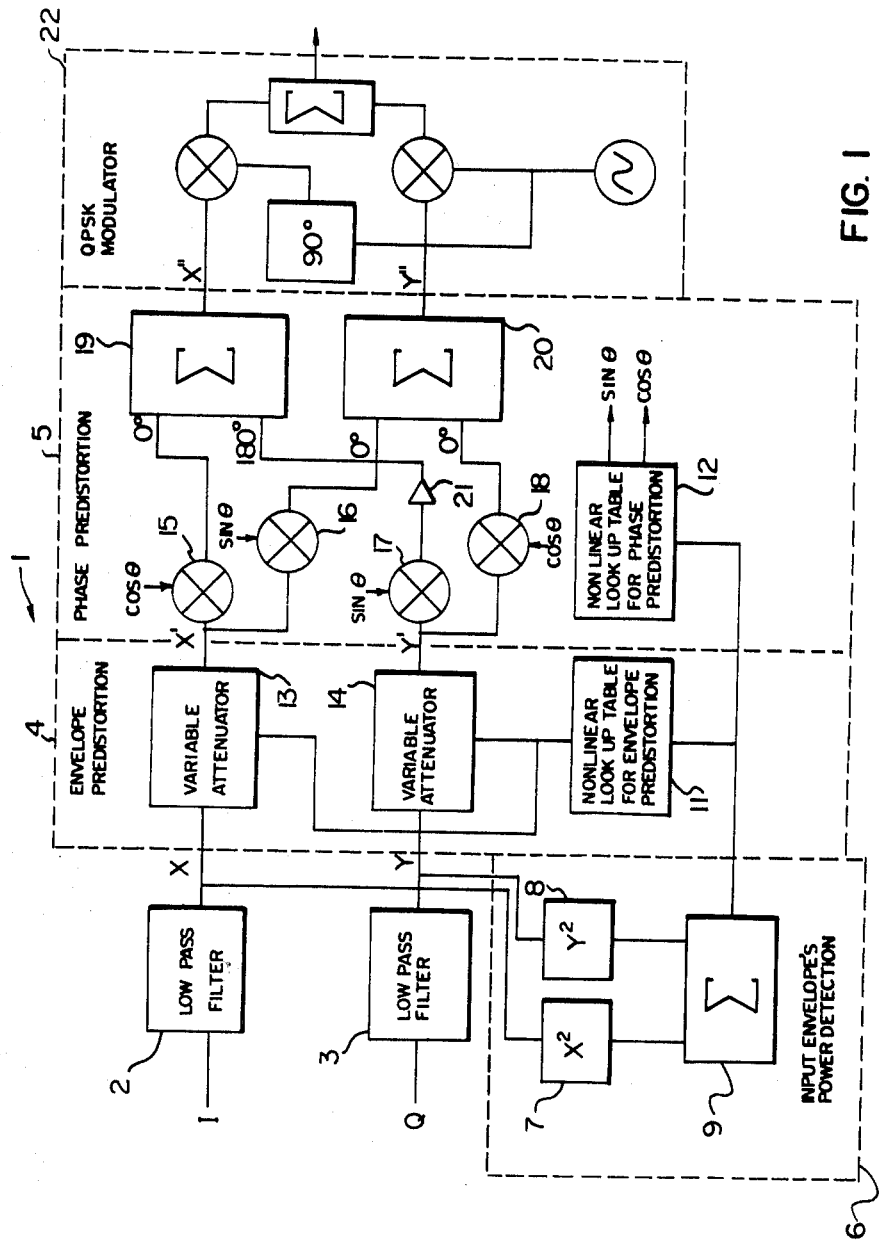
FIG. 1 illustrates a baseband linearizer in accordance with the present invention.

The baseband linearizer in accordance with the present invention predistorts the in-phase and quadrature components of the baseband signal in order to cancel the effect of the memoryless nonlinearity represented by the above equation. An embodiment of the linearizer 1 is illustrated in FIG. 1 wherein the in-phase component X and the quadrature component Y are received from low pass filters 2 and 3 in the inphase and quadrature channels respectively. The linearizer 1 consists essentially of a first circuit 4 which predistorts the signal envelope and a second circuit 5 which predistorts the signal phase, in a predetermined manner. This predistortion is dependent on the signal envelope power and the amplifier characteristics.

A circuit 6 for measuring the instantaneous input signal power has an input connected to each of the I and Q channels for receiving the in-phase X and quadrature Y components. Circuit 6 includes squaring circuits 7 and 8 coupled to a summing circuit 9 in order to provide the power level envelope of the input signal. This envelope signal is fed to look-up tables 11 and 12 in predistortion circuits 4 and 5. These tables 11 and 12 contain multiplying factors, which are based on the high power amplifier transfer characteristics. These tables provide the instantaneous envelope attenuation factor and phase rotation factor respectively which are applied to the baseband signal as a function of the instantaneous power level of the envelope.

Figure 2:
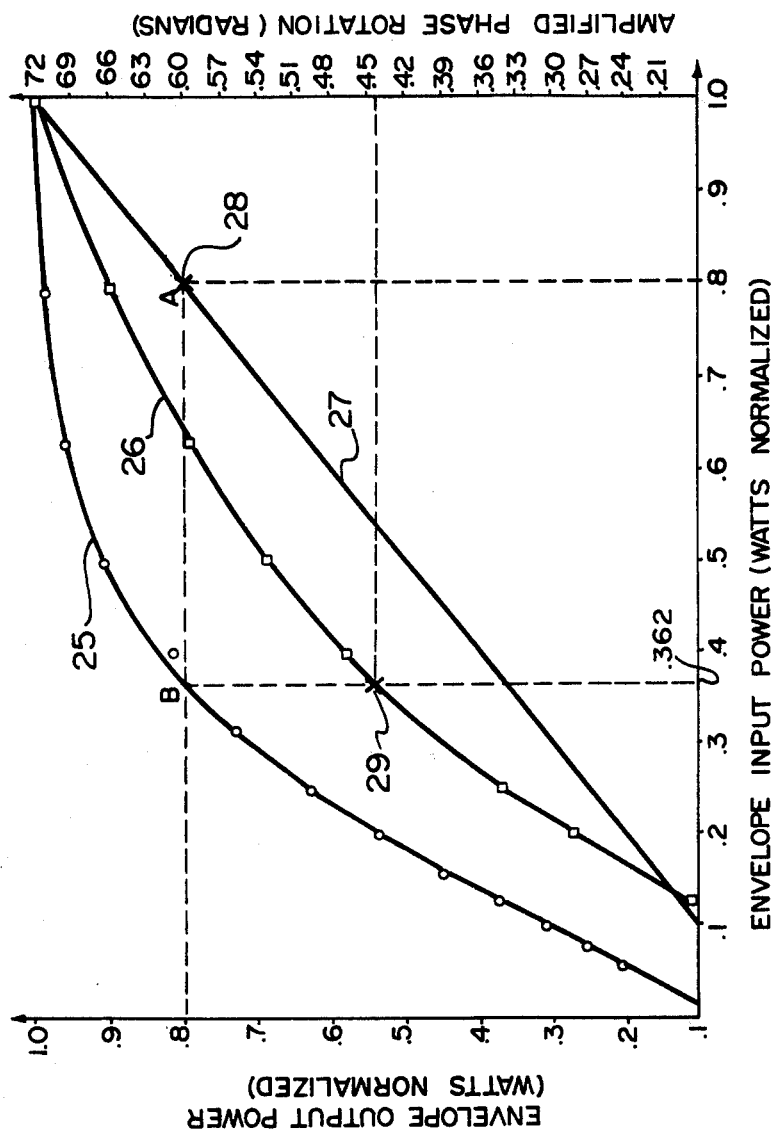
FIG. 2 illustrates the high power amplifier transfer characteristics in a normalized linear scale.

As mentioned above, the power amplifier characteristics are normally provided as curves on a graph such as curves 25 and 26 shown in FIG. 2. Curve 25 illustrates the amplitude characteristic of the amplifier and curve 26 illustrates the phase characteristic of the amplifier as a function of the instantaneous input power level of the envelope. The determination of the multiplying factors is described with respect to FIG. 2.

The multiplying factors in the look-up tables 11 and 12 may be determined by graphically inverting the characteristics, 25-26, supplied by the manufacturer. This is done by first selecting a maximum point on the amplitude transfer characteristic to which linearity is desired, this is normally in the region where the amplifier saturates. Curves 25 and 26 are normallized to this point. In FIG. 2, the linear curve 27 is selected as the desired linear output of the linearized amplifier.

As an example, if the input signal has an instantaneous power level of 0.8, the non-linearized amplifier will provide an output in the order of 0.98 whereas an output of 0.8 is desired, i.e. point 28 on curve 27. In order to achieve this, this signal will have to be attenuated to approximately 0.36. The multiplying factor $f_{(0.8)}$ for this point may be calculated as follows:

$$\frac{\text{power input}}{\text{power output}} = \frac{(fX)^2}{(X)^2} = f^2$$

where X is the amplitude of the input signal. In this example, $X^2 = 0.8$ and $(fX)^2 = 0.36$. Therefore, $$f_{(.8)} = \left(\frac{.36}{.8}\right)^{\frac{1}{2}}$$

$$f_{(.8)} = 0.67$$

Thus, when the input power is at 0.8, the input signal will be multiplied by 0.67 to provide the linear output signal.

The phase rotation factors are determined in a similar manner, however, their calculation will be based on the actual amplitudes that the amplifier sees rather than the input amplitudes. For example, the input power of 0.8 used above, must be linearized to 0.36. Thus the phase rotation factor will be approximately 0.44 radians based on point 29 of curve 26 which is at the power level of the actual attenuated input signal that the power amplifier will see.

Figure 3:
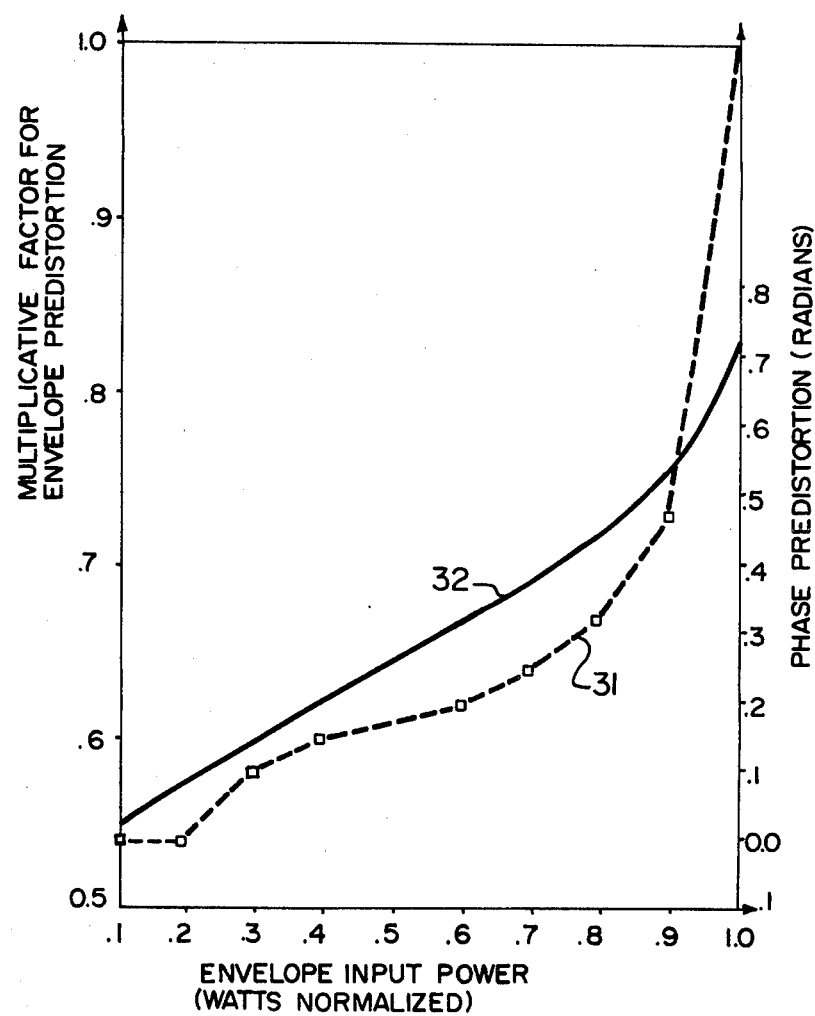
FIG. 3 illustrates example graphs of attenuation factors and phase rotation factors.

The envelope predistortion circuit 4 includes a variable attenuator 13 in the in-phase channel and a variable attenuator 14 in the quadrature phase channel. These attenuators 13, 14 attenuate the two components X and Y of the baseband signal equally, however, they do not change the signal phase. Graph 31 in FIG. 3 illustrates an example of a look-up table for the attenuation multiplying factor.

The phase predistortion circuit 5 receives the attenuated components X' and Y' signals from the envelope predistortion circuit 4 and predistorts the angle formed by the two components of the signal without affecting the envelope amplitude. The circuit 5 rotates the phasor of the signal by an angle which negates the rotation done by the high power amplifier, normally this angle will increase as the input power increases. Graph 32 in FIG. 3 illustrates an example of the look-up table for the rotation factor. The phase predistortion circuit 5 may consist of four multiplying circuits 15, 16, 17 and 18, and two summing circuits 19 and 20. The X' component is fed to multiplier circuits 15 and 16 which also receive cos $\theta$ and sin $\theta$ signals, respectively, from the look-up table 12. The Y' component is fed to multiplier circuits 17 and 18 which also receive sin $\theta$ and cos $\theta$ signals, respectively, from look-up table 12. Summing circuit 19 sums the output from multiplier 17 and the output from multiplier 15 inverted by an inverter 21, to provide an inphase component $X'' = X' \cos \theta - Y' \sin \theta$, while summing circuit 20 sums the outputs from multipliers 16 and 18 to provide a quadrature component $Y'' = Y' \cos \theta + X' \sin \theta$.

Look-up tables 11 and 12 may be implemented by appropriately designed shaping circuits of the type described in the text, "Operational Amplifier, Design and Applications", Graeme et al, McGraw-Hill, 1971, Chapter 7, pp 236-265, or in any other conventional manner.

The outputs from the phase predistortion circuit 5 are fed to any conventional modulation circuit 22 such as the QPSK modulator shown in FIG. 1.

Figure 4:
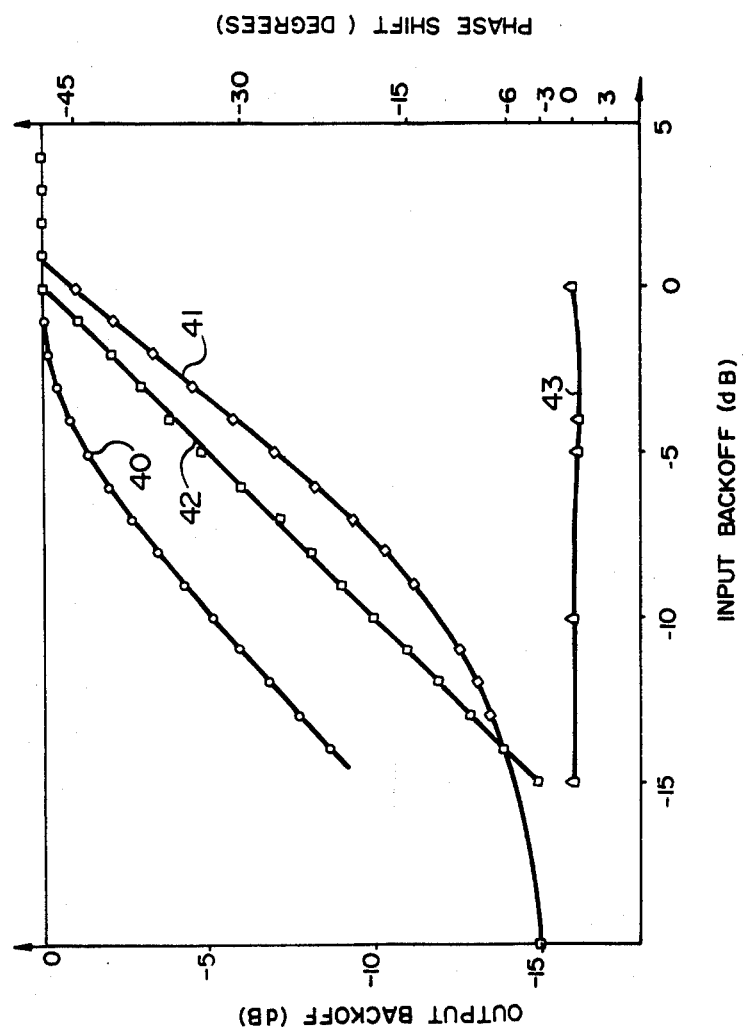
FIG. 4 illustrates the high power amplifier transfer characteristics without and with baseband linearization using a dB scale.

FIG. 4 illustrates the non-linear amplitude 40 and phase 41 transfer characteristics of a typical high power amplifier. By predistorting the envelope and the phase of the baseband signals in accordance with the present invention, these characteristics may effectively be transformed into the amplitude 42 and phase 43 transfer characteristics also shown in FIG. 4.

Taking as a example, a system with parameters based on the data given in the TDMA Intelsat V communication system specifications, as published by Intelsat document number BG-42-65E, June 26, 1980, an improved spectral efficiency can be expected. Quadriphase shift keyed modulation is preferably used since it is well suited for a cascaded nonlinear channel in the presence of adjacent-channel interference. In an evaluation of the Intelsat V system, it was determined that for an $E_b/N_o = 12$ dB, the probability of error is $P_e = 5 \times 10^{-6}$, for an output backoff (OBO) of 5 dB; where $E_b$ is the average modulated bit energy measured prior to the receive filter and $N_o$ is the spectral density of the white gaussian noise. This $P_e$ corresponds to a degradation, from the ideal theoretical linear channel performance, of about 2 dB.

The use of the baseband linearizer, as described in accordance with the present invention, presents many benefits. In particular, a significant reduction in spectral spreading is noted, and the power requirements for a high power amplifier may be reduced by up to 2 dB. Probability of error improvements are also observed in the presence of adjacent channel interference, and fading. Moreover, one of the unexpected results was the reduction of the effects of co-channel interferences.

Many modifications in the above described embodiments of the invention can be carried out without departing from the scope thereof and, therefore, the scope of the present invention is intended to be limited only by the appended claims.

I claim:

1. A baseband linearizer for a high power amplifier in a modulation transmission system wherein in-phase X and quadrature phase Y components of a baseband signal are filtered through low pass filters, comprising:

first means for receiving the filtered in-phase X and quadrature phase Y components of the baseband signal and attenuating the amplitudes of the baseband signal X, Y components as a function of the high power amplifier transfer characteristics;

second means for receiving the attenuated baseband signal X', Y' components and rotating the phase angle of the attenuated baseband signal X', Y' components as a function of the high power amplifier transfer characteristic, and means for detecting the power level of the filtered in-phase X and quadrature phase Y components of the baseband signal for controlling the first means and the second means.

2. A baseband linearizer as claimed in claim 1 wherein the first means includes a first attenuator and a second attenuator for receiving and attenuating the amplitude in the in-phase X and quadrature Y components of the baseband signal, and first memory means for providing an attenuation factor to the first and second attenuators under the control of the power level detecting means.

3. A baseband linearizer as claimed in claim 2 wherein the second means includes a phase rotation circuit for rotating the phase of the attenuated baseband signal having an in-phase component X' and a quadrature phase component Y' to provide an output signal having an in-phase component $X''=X'\cos\theta - Y'\sin\theta$ and a quadrature phase component $Y''=Y'\cos\theta + X'\sin\theta$ where the rotation factor $\theta$ is provided to the phase rotation circuit by second memory means under the control of the power level detecting means.

4. A baseband linearizer as claimed in claim 3 wherein the phase rotation circuit includes a first multiplier and a second multiplier for receiving the in-phase component X' and signals $\cos\theta$ and $\sin\theta$, respectively, from the memory means; a third multiplier and a fourth multiplier for receiving the quadrature component Y' and signals $\sin\theta$ and $\cos\theta$, respectively, from the multiplier; first summing means for receiving the output from the first multiplier and an inverted output from the third multiplier to provide in-phase component X" of the predistorted baseband signal; and second summing means for receiving the output from the second multiplier and the output from the fourth multiplier to provide the quadrature component X" of the predistorted baseband signal.

* * * * *